(12) United States Patent
Bell et al.

(10) Patent No.: US 7,123,541 B2
(45) Date of Patent: Oct. 17, 2006

(54) MEMORY WITH ADDRESS MANAGEMENT

(75) Inventors: Debra M. Bell, Boise, ID (US); Greg A. Blodgett, Nampa, ID (US)

(73) Assignee: Micron Technology Inc., Boise, ID (US)

( * ) Notice: Subject to any disclaimer, the term of this patent is extended or adjusted under 35 U.S.C. 154(b) by 0 days.

(21) Appl. No.: 10/881,273

(22) Filed: Jun. 29, 2004

(65) Prior Publication Data
US 2004/0233707 A1 Nov. 25, 2004

Related U.S. Application Data

(62) Division of application No. 10/100,770, filed on Mar. 19, 2002, now Pat. No. 6,798,711.

(51) Int. Cl.
*G11C 8/18* (2006.01)
(52) U.S. Cl. .............. 365/233.5; 365/230.01; 365/227; 365/230.08
(58) Field of Classification Search .......... 365/230.01, 365/230.08, 233.5, 227
See application file for complete search history.

(56) References Cited

U.S. PATENT DOCUMENTS

| | | | |
|---|---|---|---|
| 4,141,068 A | 2/1979 | Mager et al. | |
| 4,509,115 A | 4/1985 | Menton et al. | |
| 4,789,960 A * | 12/1988 | Willis | 345/534 |
| 4,809,233 A * | 2/1989 | Takemae | 365/222 |
| 4,870,619 A | 9/1989 | Van Ness | |
| 4,924,427 A | 5/1990 | Savage et al. | |
| 4,933,907 A * | 6/1990 | Kumanoya et al. | 365/222 |
| 5,488,587 A * | 1/1996 | Fukumoto | 365/222 |
| 5,608,682 A * | 3/1997 | Jinbo et al. | 365/222 |
| RE35,825 E | 6/1998 | Zagar | |
| 5,778,446 A | 7/1998 | Kim | |
| 5,883,855 A | 3/1999 | Fujita | |
| 5,898,639 A | 4/1999 | Blodgett | |
| 5,912,849 A * | 6/1999 | Yasu et al. | 365/195 |
| RE36,264 E | 8/1999 | Merritt et al. | |
| 5,995,750 A * | 11/1999 | Samson et al. | 718/107 |
| 5,999,480 A | 12/1999 | Ong et al. | |
| 6,111,797 A | 8/2000 | Shirley | |
| 6,147,925 A | 11/2000 | Tomishima et al. | |
| 6,163,489 A | 12/2000 | Blodgett | |
| 6,321,316 B1 | 11/2001 | Manning | |
| 6,347,063 B1 * | 2/2002 | Dosaka et al. | 365/233 |
| 6,356,500 B1 | 3/2002 | Cloud et al. | |
| 6,438,055 B1 | 8/2002 | Taguchi et al. | |
| 6,466,499 B1 | 10/2002 | Blodgett | |
| 6,473,358 B1 * | 10/2002 | Noda et al. | 365/230.06 |
| 6,507,532 B1 * | 1/2003 | Fujino et al. | 365/230.03 |
| 6,590,822 B1 * | 7/2003 | Hwang et al. | 365/222 |
| 6,633,505 B1 * | 10/2003 | Higashiho | 365/222 |
| 6,657,902 B1 * | 12/2003 | Mizugaki | 365/189.05 |
| 6,700,828 B1 * | 3/2004 | Mizugaki | 365/222 |
| 6,724,686 B1 * | 4/2004 | Ooishi et al. | 365/233 |
| 6,744,684 B1 * | 6/2004 | Arimoto et al. | 365/222 |
| 6,819,617 B1 * | 11/2004 | Hwang et al. | 365/222 |
| 6,868,034 B1 * | 3/2005 | La et al. | 365/238.5 |
| 2002/0064079 A1 | 5/2002 | Sato et al. | |
| 2003/0088753 A1 | 5/2003 | Ikeda et al. | |

FOREIGN PATENT DOCUMENTS

| | | | |
|---|---|---|---|
| JP | 356007162 A | | 1/1981 |
| JP | 360211691 A * | | 10/1985 |
| JP | 363006637 A | | 1/1988 |
| JP | 363079298 A * | | 4/1988 |
| JP | H404131949 | | 5/1992 |

* cited by examiner

*Primary Examiner*—Viet Q. Nguyen
(74) *Attorney, Agent, or Firm*—Leffert, Jay & Polglaze, P.A.

(57) ABSTRACT

The present invention allows for the reduction in power consumption of memory devices. A memory device in one embodiment prohibits address signal propagation on internal address buses based upon a function being performed by the memory. As such, some, all or none of the externally provided address signals are allowed to transition past address buffer circuitry.

16 Claims, 4 Drawing Sheets

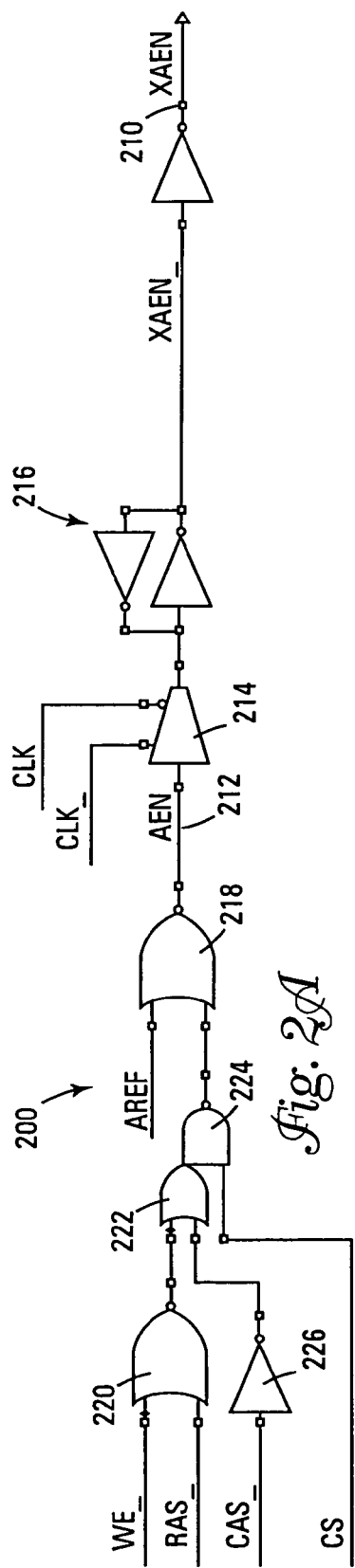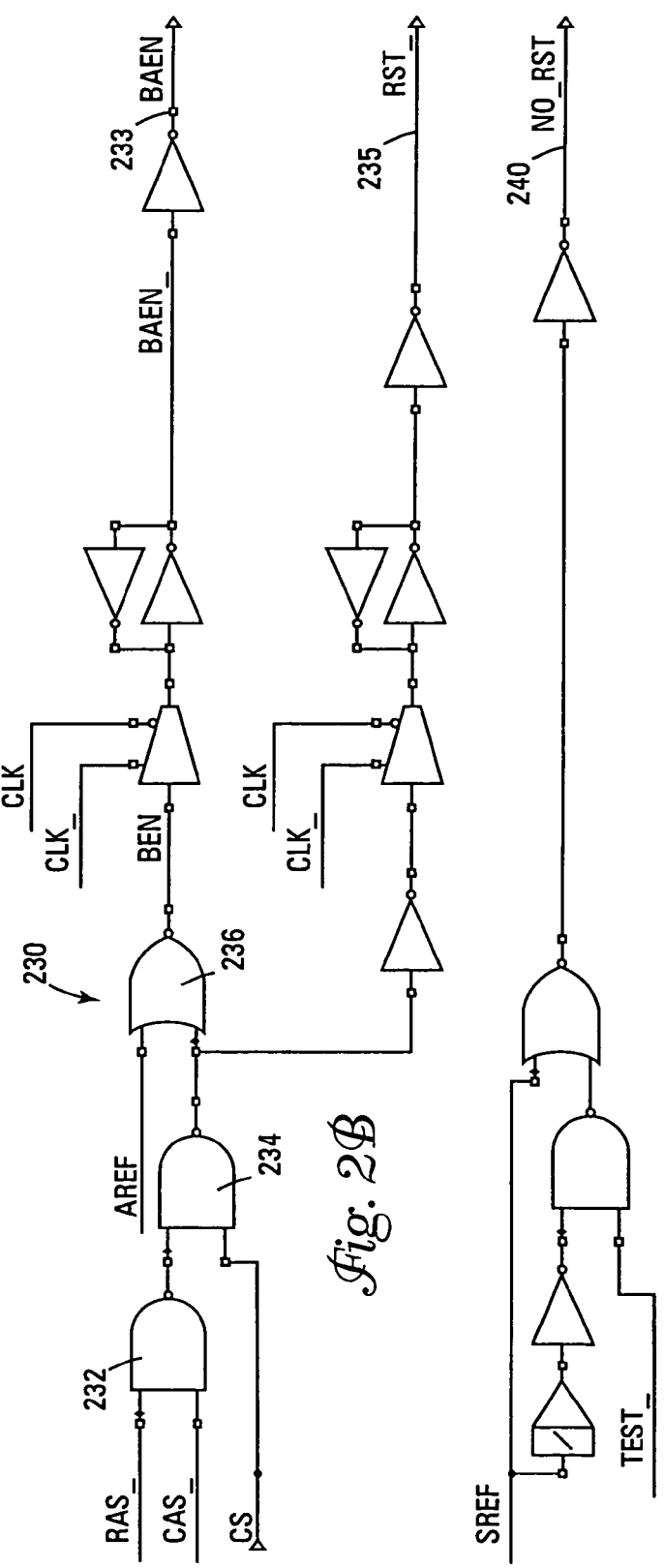
Fig. 2A
Fig. 2B
Fig. 2C

MEMORY WITH ADDRESS MANAGEMENT

CROSS-REFERENCE TO RELATED APPLICATION

This is a divisional application of U.S. patent application Ser. No. 10/100,770, titled MEMORY WITH ADDRESS MANAGEMENT, filed Mar. 19, 2002 now U.S. Pat. No. 6,798,711 which application is assigned to the assignee of the present invention and the entire contents of which are incorporated herein by reference.

FIELD OF THE INVENTION

The present invention relates generally to memory devices and in particular the present invention relates to address circuitry for memory devices.

BACKGROUND OF THE INVENTION

Memory devices are widely used in processing systems and consumer products. One type of memory device is a dynamic random access memory. Various kinds of DRAMs are commonly used. Typical examples are the synchronous DRAM (SDRAM) in which data is stored or retrieved in synchronism with a system clock and a double-data-rate SDRAM (DDR-SDRAM) which makes it possible to use both edges of a clock pulse as triggers for data access. In addition to the above described DRAMs, a RAMBUS DRAM (RDRAM) (under specifications of Rambus Inc.) in which data transfer is enabled at a high speed with a protocol-based command, and the like have also been developed.

Three prominent trends in memory design and manufacturing have been the reduction in component size, reduced operating power levels and the increase in operating speed. These three trends are interrelated and often adversely affect each other. For example, component size reductions are necessary to achieve desired memory storage density without significant increases in die size. The reduction in component size can increase communication line resistances, which result in slower operating speeds and increased power consumption.

All memory devices use an addressing scheme to access memory cells, or locations. Specifically, many memory devices have memory cell arrays that are arranged in multiple banks of rows and columns. External address input connections are used to provide the bank, row and column addresses. These addresses are usually buffered and routed to different locations of the memory device.

For the reasons stated above, and for other reasons stated below which will become apparent to those skilled in the art upon reading and understanding the present specification, there is a need in the art for a memory device address management system that allows for reduced power consumption.

SUMMARY OF THE INVENTION

The above-mentioned problems with memory devices and other problems are addressed by the present invention and will be understood by reading and studying the following specification.

In one embodiment, a memory device comprises an address input connection, address buffer circuitry coupled to the address input connection to provide an address signal output on a buffer output in response to an input address signal, internal circuitry coupled to receive the address signal output, and control circuitry coupled to selectively allow the address signal output to be transmitted to the internal circuitry.

In another embodiment, a dynamic random access memory (DRAM) comprises a plurality of address input connections to receive externally provided bank, row and column addresses, and a plurality of internal address communication lines coupled to receive the bank, row and column addresses. A plurality of driver circuits are coupled to the plurality of internal address communication lines to drive the bank, row and column addresses on the plurality of internal address communication lines. Enable circuitry is coupled to control an input of the plurality of driver circuits to selectively enable the bank, row and column addresses to propagate on the plurality of internal address communication lines.

A method of operating a memory device comprises receiving externally provided control signals to instruct the memory to perform a selected function, receiving externally provided address signals, and prohibiting selected ones of the address signals from propagating through internal memory device circuitry based upon the selected function.

A method of operating a DRAM comprises receiving externally provided control signals to instruct the memory to perform a Read, Write, Active, or NOP (no operation) function, receiving externally provided row, column and bank address signals, and prohibiting selected ones of the row, column and bank address signals from propagating through internal DRAM address buses based upon a selected function.

BRIEF DESCRIPTION OF THE DRAWINGS

FIGS. 2A, 2B and 2C are schematic diagrams of address signal propagation control circuitry of an embodiment of the present invention;

DETAILED DESCRIPTION OF THE DRAWINGS

In the following detailed description of the preferred embodiments, reference is made to the accompanying drawings, which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims.

The present invention allows for the reduction in power consumption of memory devices. In general, the need to reduce power consumption has increased with new generations of memory devices. One circuit feature on memory devices that consumes power is address signal propagation from external input connections to numerous internal locations on the memory die.

Current memory devices, such as double data rate (DDR) SDRAM's are specified to operate at relatively fast speeds. The reduction in feature sizes to provide commercially desired memory densities has resulted in an increased unit resistance for internal communication lines (conductors). Thus, a propagation time to communicate a signal across the die either requires more time, or additional circuitry to drive the signal. A typical solution to this problem is to provide repeater circuits along the conductor path. During signal propagations, each of these repeater circuits transitions data states and consumes power. The present invention is generally directed at reducing the number of circuit transitions to reduce power consumption.

A memory device, such as a DDR SDRAM, has connections to receive control input signals as well as address input signals. The control signals are used to instruct the memory to perform specific functions, such as read, write, refresh, and special operations. During these functions some, all or none of the address inputs signals are needed. Thus, the present invention determines which address signals are not needed during a performed function and prohibits the propagation of the address signals across signal buses of the die.

Figure 1:
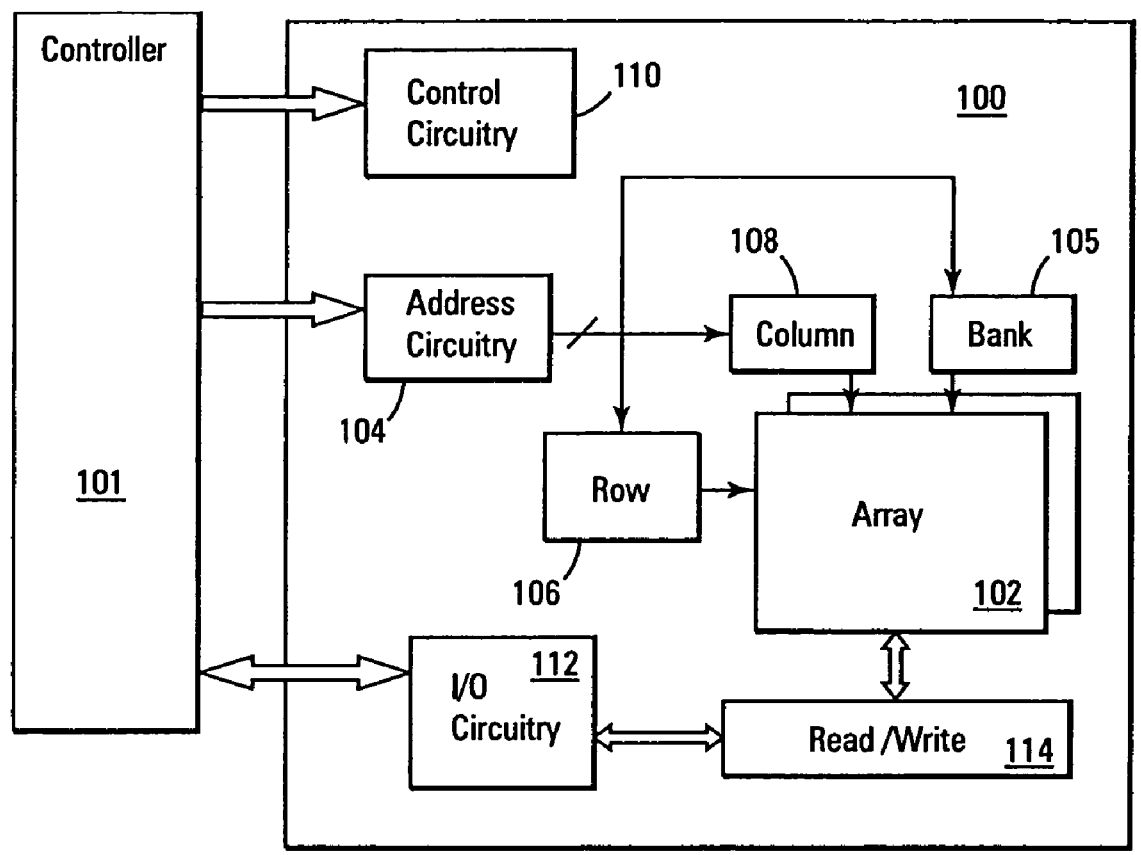
FIG. 1 is a block diagram of a memory device of an embodiment of the present invention.

Referring to FIG. 1, a block diagram of a memory device 100 according to one embodiment of the present invention is described. The memory device includes an array of memory cells 102 and address circuitry 104 to access the memory cells. Bank 105, row 106 and column 108 decoders are used to analyze externally provided address signals. A control circuit 110 is provided to perform read and write operations in response to externally provided control signals from controller 101. Bi-directional data communication with the memory array is performed by I/O circuitry 112 and read/write circuitry 114. It will be appreciated by those skilled in the art, with the benefit of the present description, that the memory device has been simplified and that additional circuitry and features may be required. In one embodiment, the memory device is a synchronous DRAM. In yet another embodiment the memory is a DDR SDRAM. The present invention, however, is not limited to a dynamic memory, but can be any memory device having address input connections, such as SDRAM, RDRAM, Flash, DRAM, SRAM, SGRAM and the other semiconductor memories.

Table 1 illustrates some functions that can be performed by an SDRAM embodiment. These functions include deselect, where the memory device Chip Select (CS_) input signal is inactive (H). When the memory device is not selected, none of the address input signals need to be propagated to internal circuits. A No Operation (NOP) function is a type of idle state for the memory. That is, the memory is selected, but no operation is specified. In this state, the Row Address Strobe (RAS_), Column Address Strobe (CAS_) and Write Enable (WE_) are not active and none of the address input signals need to be propagated to internal circuits. An Active function is used to select a memory array bank and active row. Thus, address input connections that are used to define the bank and row addresses need to allow propagation to internal locations. Similarly, the Read and Write operations need bank and column addresses to propagate to internal locations. During Burst Terminate and Auto Refresh functions none of the address input signals need to propagate to internal circuits. Finally, during Precharge and Load Mode Register functions some of the address inputs are used to receive command codes. As such, these address input connections need to remain active.

TABLE 1

| Function | CS_ | RAS_ | CAS_ | WE_ | ADDRESSES REQUIRED |
|---|---|---|---|---|---|
| Deselect (NOP) | H | X | X | X | X |
| No Operation (NOP) | L | H | H | H | X |
| ACTIVE (select Bank and active Row) | L | L | H | H | Bank/Row |
| READ (select Bank and Column) | L | H | L | H | Bank/Col |
| WRITE (select Bank and Column) | L | H | L | L | Bank/Col |
| BURST TERMINATE | L | H | H | L | X |
| PRECHARGE | L | L | H | L | Code |
| AUTO REFRESH | L | L | L | H | X |
| LOAD MODE REGISTER | L | L | L | L | Op-Code |

The above-described memory functions are not exhaustive, but provide examples of when different address signals are required, or not needed. Again, the present invention is not limited to DRAM's, but can be embodied in any volatile or non-volatile memory.

FIGS. 2A, 2B and 2C are schematic diagrams of circuits used to control address signal propagation. Circuit 200 generates address driver enable signals based on the externally provided command signals applied to the memory device. The output 210 of FIG. 2A is an XAEN (eXternal Address ENable) signal. The XAEN signal is active when an intermediate address enable signal (AEN) at node 212 is a logic high. When the Clock signal, CLK, goes high (CLK_low), the output of pass gate 214 is latched by a weak feedback inverter 216. XAEN is held valid for the CLK high time.

The AEN signal, provided by NOR gate 218, is a combination of AREF (Auto REFresh) being low and a combination of command signals that require address information. Logic circuitry, including NOR gate 220, OR gate 222, NAND gate 224 and inverter 226, provide the second input to NOR 218. If WE is inactive, and RAS_is active, then row address information is required, because the command is either an ACTIVE command, a REFRESH command (masked by AREF), or a LMR (LOAD MODE REGISTER) command.

Similarly, if CAS_is active, then the command is READ, WRITE, REFRESH (again masked by AREF) or LMR. The XAEN signal could be further controlled by looking at the bank to which the command is directed, and determining if the command is legal. For example if the command is a READ command to bank 0, but bank 0 is not active, then addresses would not need to be driven. Because an inactive CS defines a NOP, all of the input signals are gated by an active CS signal. Therefore, no addresses are driven for NOPs.

Referring to FIG. 2B, circuit 230 provides a bank address enable (BAEN) and reset (RST_) signals on output nodes 233 and 235, respectively. The bank address bits are driven when RAS_is active or CAS_is active. With RAS_or CAS_low, and CS high, NAND gates 232/234 and NOR gate 236 provide a high signal on node 233 (BAEN). In addition to the conditions where XAEN is active, BAEN is active for LMR or Precharge command that may require bank information, but not all of the address bits. This could be further decoded to include address bit A10. A Precharge command with A10 high indicates a precharge all banks command. Thus, the bank address signals would not need to be driven if A10 is driven and the receiving logic uses A10 to force all banks to precharge regardless of the state of the bank address signals (this embodiment is not illustrated).

The RST_signal on node 235 is active (low) during CLK high time only if no commands requiring addresses or bank addresses are present. If either RAS_or CAS_are active, RST_is high. If both RAS_and CAS_are high (NOP or burst terminate), then RST_is low. Referring to FIG. 2C, the no-reset (NO_RST) signal on node 240 defines the self refresh or test mode states to mask RST_and prevent the addresses and bank addresses from being cleared at CLK low time. Thus, if the SREF (self refresh) or Test_signals are high or low, respectively, the NO_RST output signal is high.

The above circuits are used to control internal buffer and driver circuits used to propagate address signals through the memory device. It will be appreciated by those skilled in the art, with the benefit of the present description, that the logic circuits used to decode the control signals can be changed and are not limited to the illustrated circuits. Further, the address signal requirements are not limited to the conditions of Table 1.

Figure 3:
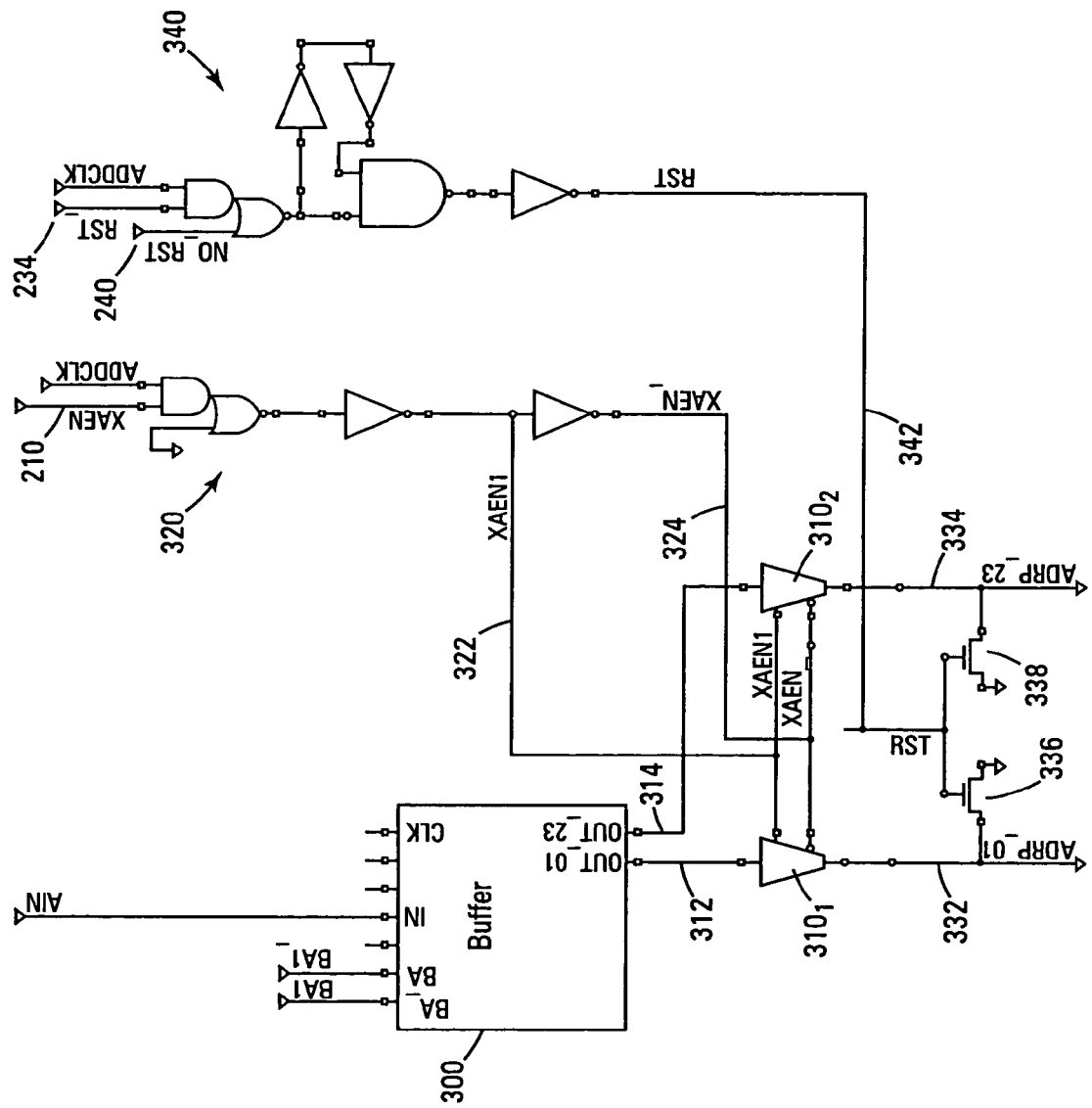
FIG. 3 is a schematic diagram of buffer and address circuitry of an embodiment of the present invention.

Referring to FIG. 3, input buffer 300 and address circuitry are described. Input buffer 300 has two outputs, OUT_01 and OUT_23. OUT_01 is the address signal enabled for driving addresses to bank 0 or 1 on node 312. OUT_23 is the address signal enabled for driving addresses to bank 2 or 3 on node 314. The BA1 and BA1_signals going into the input buffer determine which of the outputs are enabled (or both). AIN is an external address input to the memory on one of the address input connections.

Referring to circuit 320, when XAEN (node 210 of FIG. 2A) is active high, and the ADDCLK is high, both output signals XAEN1 and XAEN_on nodes 322 and 324 are active. These signals are used to enable pass gates 310, and 3102 and drive ADRP_01 and ADRP_23 on buses 332 and 334. If OUT_01 is not active pass gate 310, connects two low signals together. If OUT_01 (312) is high, then a high signal is passed to ADRP_01 and will be driven down the die to bank 0 and bank 1 logic. The OUT_23 signal is processed in the same manner. If bias transistors 336 and 338 are turned on, bus lines 332 and 334 are held low.

Circuit 340 generates an RST signal on node 342 from RST_and NO_RST of FIG. 2B. If the ADDCLK signal is inactive, or if RST_is active, bus lines 332 and 334 are reset to a logic low. That is, pull-down transistors 336 and 338 are activated. The NO_RST signal masks this function for test mode or self refresh. In self-refresh, address propagation time is not critical and a slow reset through pass gates 310 is acceptable. Thus, not resetting addresses that don't need to toggle saves power.

It is noted that the above buffer and address circuitry of FIG. 3 is provided for each address input connection. As such, a plurality of buffer circuits are provided in one embodiment of the present invention.

Figure 4:
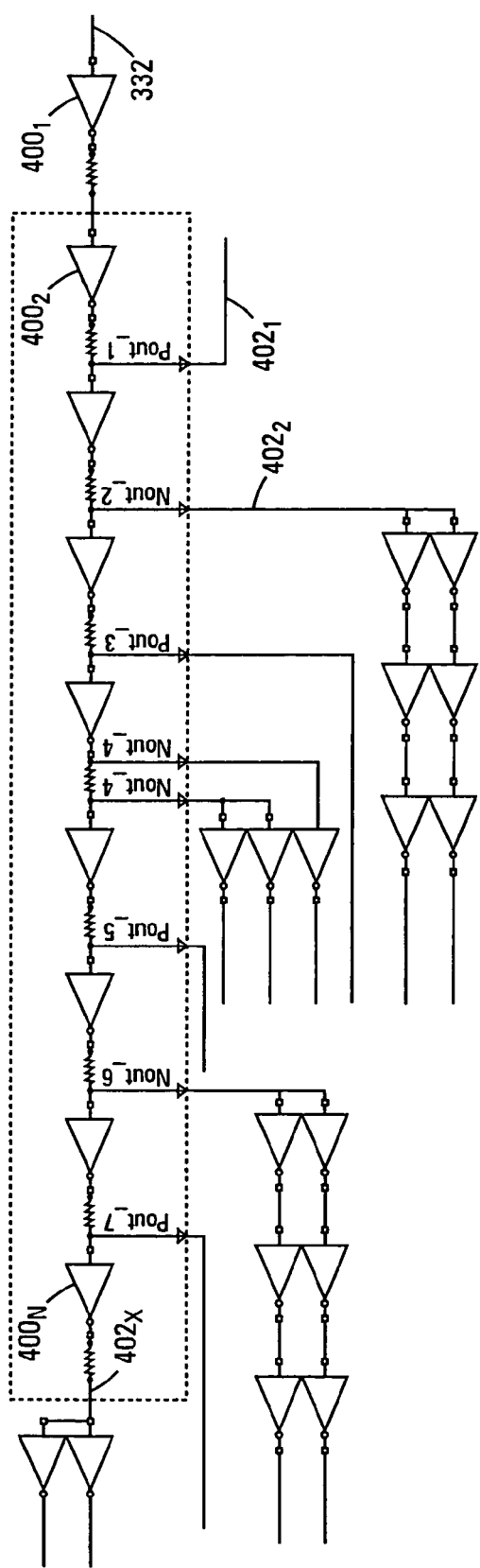
FIG. 4 is a schematic diagram of an address bus and distributed signal drivers of an embodiment of the present invention.

Referring to FIG. 4, a representative address bus is described. The resistors shown are parasitic metal resistance and capacitance models for simulating the performance of the circuit, and represent long metal routes across the die. Each of these parasitic resistors represents a route of approximately 1500 μm. The bus 332 includes a series of drivers $400_1$ to $400_N$ that "re-transmit" the address signal along the entire bus. The address signal is tapped at different locations $402_1$ to $402_X$ for use by distributed circuitry (not shown) provided in the memory device. It will be appreciated that prohibiting unnecessary address signals from propagating along the address buses can significantly reduce power consumption by the bus drivers.

CONCLUSION

The present invention allows for the reduction in power consumption of memory devices. A memory device has been described that prohibits address signal propagation on internal address buses based upon a function being performed by the memory. As such, some, all or none of the externally provided address signals are allowed to transition past input address buffer circuitry.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A method of operating a memory device comprising:
   receiving externally provided control signals to instruct the memory to perform a selected function;
   receiving externally provided address signals; and
   prohibiting selected ones of the address signals from propagating past one or more external connections and buffer circuits through to internal memory device circuitry based upon the selected function.

2. A method of operating a memory device comprising:
   receiving externally provided control signals to instruct the memory to perform a selected function;
   receiving externally provided address signals; and
   prohibiting selected ones of the address signals from propagating through internal memory device circuitry based upon the selected function;
   wherein prohibiting selected ones of the address signals comprises electrically isolating internal bus lines to prohibit signal transitions of the internal bus lines.

3. A method of operating a memory device comprising:
   receiving externally provided control signals to instruct the memory to perform a selected function;
   receiving externally provided address signals; and
   prohibiting selected ones of the address signals from propagating through internal memory device circuitry based upon the selected function;
   wherein the function is selected from one of a Read, a Write, an Active, a NOP (no operation), a Load Mode Register, a Burst Terminate, a Precharge, a Deselect, and a Refresh function.

4. The method of claim 3, wherein at least some of a plurality of column address signals are prohibited from propagating through the internal memory device circuitry while performing the Active function.

5. The method of claim 3, wherein at least some of a plurality of row address signals are prohibited from propagating through the internal memory device circuitry while performing either the Read or Write functions.

6. The method of claim 3, wherein row, column and bank address signals are prohibited from propagating through the internal memory device circuitry while performing the NOP function.

7. A method of operating a DRAM comprising:
   receiving externally provided control signals to instruct the memory to perform a Read, Write, Active, or NOP (no operation) function;
   receiving externally provided row, column and bank address signals; and prohibiting selected ones of the row, column and bank address signals from propagating through internal DRAM address buses based upon a selected function.

8. The method of claim 7, wherein at least some of the column address signals are prohibited from propagating through the internal DRAM address buses while performing the Active function.

9. The method of claim 7, wherein at least some of the row address signals are prohibited from propagating through the internal DRAM address buses while performing either the Read or Write functions.

10. The method of claim 7, wherein the row, column and bank address signals are prohibited from propagating through the internal DRAM address buses while performing the NOP function.

11. A method of operating a DRAM comprising:
receiving externally provided control signals to instruct the memory to perform a burst terminate function;
receiving externally provided row, column and bank address signals; and
prohibiting selected ones of the row, column and bank address signals from propagating through internal DRAM address buses when performing the Burst Terminate function.

12. The method of claim 11, wherein the row, column and bank address signals are received with distributed driver circuits and a pass transistor that is turned off to prohibit the selected ones of the row, column and bank address signals from propagating through the internal DRAM address buses.

13. A method of operating a DRAM comprising:
receiving externally provided control signals to instruct the memory to perform a precharge function;
receiving externally provided row, column and bank address signals; and
prohibiting selected ones of the row, column and bank address signals from propagating through internal DRAM address buses when performing the Precharge function.

14. The method of claim 13, wherein the row, column and bank address signals are received with distributed driver circuits and a pass transistor that is turned off to prohibit the selected ones of the row, column and bank address signals from propagating through the internal DRAM address buses.

15. A method of operating a DRAM comprising:
receiving externally provided control signals to instruct the memory to perform a refresh function;
receiving externally provided row, column and bank address signals; and
prohibiting selected ones of the row, column and bank address signals from propagating from one or more buffer circuits through to internal DRAM address buses when performing the Refresh function.

16. A method of operating a DRAM comprising:
receiving externally provided control signals to instruct the memory to perform a refresh function;
receiving externally provided row, column and bank address signals; and
prohibiting selected ones of the row, column and bank address signals from propagating through internal DRAM address buses when performing the Refresh function;
wherein the row, column and bank address signals are received with distributed driver circuits and a pass transistor that is turned off to prohibit the selected ones of the row, column and bank address signals from propagating through the internal DRAM address buses.

* * * * *